United States Patent [19]
Gardner et al.

[11] Patent Number: 5,926,700
[45] Date of Patent: Jul. 20, 1999

[54] SEMICONDUCTOR FABRICATION HAVING MULTI-LEVEL TRANSISTORS AND HIGH DENSITY INTERCONNECT THEREBETWEEN

[75] Inventors: Mark I. Gardner, Cedar Creek; Daniel Kadosh, Austin, both of Tex.

[73] Assignee: Advanced Micro Devices, Inc.

[21] Appl. No.: 08/850,871

[22] Filed: May 2, 1997

[51] Int. Cl.⁶ .................................................. H01L 21/336
[52] U.S. Cl. ................................................ 438/152; 438/618
[58] Field of Search ..................................... 438/152, 618, 438/637, 666, 668, FOR 426, FOR 155, FOR 212, FOR 184, FOR 201, FOR 206; 257/67, 69, 508

[56] References Cited

U.S. PATENT DOCUMENTS

| | | | |
|---|---|---|---|
| 4,498,226 | 2/1985 | Inoue et al. | 438/152 |
| 4,902,637 | 2/1990 | Kondou et al. | 438/152 |
| 5,470,776 | 11/1995 | Ryou | 438/152 |
| 5,521,401 | 5/1996 | Zamanian et al. | 257/67 |
| 5,747,367 | 5/1998 | Kadosh et al. | 438/152 |
| 5,808,319 | 9/1998 | Gardner et al. | 257/67 |
| 5,818,069 | 10/1998 | Kadosh et al. | 257/67 |
| 5,834,341 | 11/1998 | Chen | 438/152 |

*Primary Examiner*—Mary Wilczewski
*Attorney, Agent, or Firm*—Kevin L. Daffer; Conley, Rose & Tayon

[57] ABSTRACT

An integrated circuit fabrication process is provided in which an elevated doped polysilicon structure may be formed. The elevated structure may serve as a junction area of a transistor formed entirely within and upon the elevated polysilicon. The elevated structure frees up space within the lower level substrate for additional transistors and/or lateral interconnect, a benefit of which is to promote higher packing density within the integrated circuit. A transistor is provided which includes a gate conductor spaced between a pair of junctions. A primary interlevel dielectric is deposited across the transistor. A polysilicon structure is formed within a select portion of the upper surface of the primary interlevel dielectric. The polysilicon structure is a spaced distance above and a lateral distance from the transistor. A dopant is implanted into the polysilicon structure. A secondary interlevel dielectric is deposited across the primary interlevel dielectric and the doped polysilicon structure. Select portions of the primary and secondary interlevel dielectrics are then removed to expose one of the junctions and a portion of the doped polysilicon structure arranged proximate this junction. An interconnect is formed contiguously between the junction and the polysilicon structure by depositing a conductive material within the removed portions.

12 Claims, 5 Drawing Sheets

SEMICONDUCTOR FABRICATION HAVING MULTI-LEVEL TRANSISTORS AND HIGH DENSITY INTERCONNECT THEREBETWEEN

BACKGROUND OF THE INVENTION

1. Field of the Invention

This invention relates to integrated circuit fabrication and, more partirly, to forming active transistor devices in dissimilar elevation planes and interconnecting those devices with minimum lateral space requirement.

2. Description of the Related Art

Active devices are well known. For example, active devices are classified as any device which is not passive. A transistor is but one example of an active device. Transistors are therefore regarded as a basic building block of an integrated circuit. Transistor fabrication typically involves forming source/drain impurity regions (hereinafter "junctions") within a single crystalline silicon substrate and gate conductors spaced from the substrate by a gate dielectric arranged between the junctions. Ion implantation of dopants is primarily used to form junctions. Alternatively, although less often used, the junctions may be formed by diffusion doping. Ion implantation involves placing energetic, charged atoms or molecules directly into the substrate surface. The number of implanted dopant atoms entering the substrate is more easily controlled using ion implantation. Ion implantation results in junctions having a majority carrier opposite that of the surrounding bulk substrate or well area.

Because of the increased desire to build faster and more complex integrated circuits, it has become necessary to form relatively small, closely spaced multiple transistors within a single integrated circuit. Whenever the integrated circuit involves parallel coupling of numerous transistors, a source junction of one transistor may be mutually coupled to a source junction of another transistor. Further, it may be necessary to couple a drain junction of one transistor to a drain junction of another transistor. Mutual source or drain junctions are commonly used to provide such coupling. Mutual source or drain junctions are typically formed within one elevation level (i.e., substrate of an integrated circuit). Thus, transistors pairs can involve a layout which allows the transistors to share a mutual junction. FIG. 1 illustrates the utility of mutual source or drain junctions.

The circuit diagram of FIG. 1 depicts a portion of a two input NAND gate 10. The output from NAND gate 10 is shown fed into the input of inverter 20. Similar to NAND gate 10, only a portion of inverter 20 is shown. NAND gate 10 includes a pair of transistors 12 and 14 arranged in parallel. Transistors 12 and 14 share a mutual source junction 16 which provides power coupling lo the transistors. Transistors 12 and 14 share a mutual drain junction 18. FIG. 1 illustrates the benefits of using mutual source or drain junctions in modern day integrated circuit layout. In most core logic areas of an integrated circuit there are logic gates and interconnection between those gates. A substantial portion of the core logic areas involves routing interconnect between gates or enlarging junctions to accommodate mutual connection to those junctions. In either instance, the conventional solution to high density core layout is the occupation of lateral area.

Unfortunately, since transistors are generally formed within the silicon-based substrate of an integrated circuit, the number of transistors per integrated circuit is limited by the available lateral area of the substrate. Moreover, transistors cannot employ the same portion of a substrate, and increasing the area occupied by the substrate is an impractical solution to this problem. Thus, packing density of an integrated circuit is somewhat sacrificed by the common practice of forming transistors exclusively within a substrate having a limited amount of area. It is therefore desirable that a semiconductor fabrication process be developed for the formation of more densely packed transistors. Such a process would lead to an increase in circuit speed as well as an increase in circuit complexity.

SUMMARY OF THE INVENTION

The problems outlined above are in large part solved by the fabrication process of the present invention. That is, a method for forming doped polysilicon structures elevated above an integrated circuit substrate is provided. The elevated, doped polysilicon structures provide another elevation plane on which and into which active devices can be drawn. This ensures a multi-level transistor fabrication method. Of prime importance, however, is the interconnection between transistors on one level (i.e., within the single crystalline substrate or "substrate") and transistors on another level (i.e., in the polycrystalline substrate or "elevated polysilicon substrate"). In instances where a common source (or drain) connection is needed, improvements to the interconnect scheme is provided.

In a multi-level integrated circuit, the elevated transistor and, more specifically, the elevated source/drain junctions are located a spaced distance above the substrate and the substrate-embodied transistors. Active areas are formed in the elevated polysilicon substrate. Therefore, junctions of transistors located within the substrate must be efficiently coupled to the source/drain junctions (i.e., elevated junctions) within the elevated polysilicon substrate. Furthermore, gate conductors disposed upon the substrate may also be coupled to the elevated junctions. An integrated circuit having such a configuration encourages the formation of transistors within a substrate and at an elevation removed from the substrate, providing for a more densely packed integrated circuit.

According to one embodiment, a transistor is provided which is disposed upon and within the substrate. The transistor includes a gate conductor spaced between a pair of junctions. A primary interlevel dielectric may be deposited across the transistor and the substrate. A select portion of an upper surface of the primary interlevel dielectric is then removed to form a trench extending horizontally above and laterally removed from the substrate. Polycrystalline silicon, i.e., polysilicon may be chemical vapor deposited ("CVD") across the primary interlevel dielectric and into the trench. Portions of the polysilicon exclusive of the trench may then be removed to form a polysilicon structure bounded exclusively within the trench.

The polysilicon structure is implanted with a particular type of dopant such that the structure may have an opposite type of majority carrier as the junctions below. A secondary interlevel dielectric may then be deposited across the doped polysilicon structure and the primary interlevel dielectric. Portions of the primary and secondary interlevel dielectrics are then removed to partially expose at least one of the transistor junctions and the polysilicon structure. In fact, a portion of the upper surface of the polysilicon structure as well as the sidewall surface nearest this portion are preferably exposed. Thus, an upper portion of the exposed region of the polysilicon structure may be implanted to have the same type of majority carrier as the junctions below (i.e., the junction that had been partially exposed). A conductive material may be formed within the removed portions of the primary and secondary interlevel dielectrics to form a contiguous interconnect between the polysilicon structure and the transistor junction nearest to the structure.

In an alternate embodiment, a conductive material may be formed through the primary and secondary interlevel dielectrics to the upper surface of the gate conductor of the transistor. Further, a second polysilicon structure may be formed within the primary interlevel dielectric laterally spaced from the first polysilicon structure. It is desired that the second polysilicon structure also reside a spaced distance above and laterally from the transistor. The second polysilicon structure is preferably laterally spaced from the first polysilicon structure. The second polysilicon structure may be coupled to the nearest transistor junction by an interconnect. Additional transistors may be formed within both polysilicon structures and within the substrate such that the transistors within the polysilicon structures are physically removed from the substrate, thus freeing the substrate for receiving an overall greater number of transistors.

The present invention exhibits advantageous features over conventional methods of semiconductor fabrication partially due to the intention that junctions across a monolithic integrated circuit may be formed in separate horizontal planes. Removing the source/drain junctions from the silicon-based substrate frees more lateral area for forming more transistors across the substrate plane. Thus, a larger number of transistors may exist within a circuit employing the elevated polysilicon substrate. The increase in packing density of transistors further leads to an increase in the amount of interconnections between transistors. A layout design employing elevationally raised junctions therefore provides a more densely packed integrated circuit.

BRIEF DESCRIPTION OF THE DRAWINGS

Other objects and advantages of the invention will become apparent upon reading the following detailed description and upon reference to the accompanying drawings in which.

Figure 1:
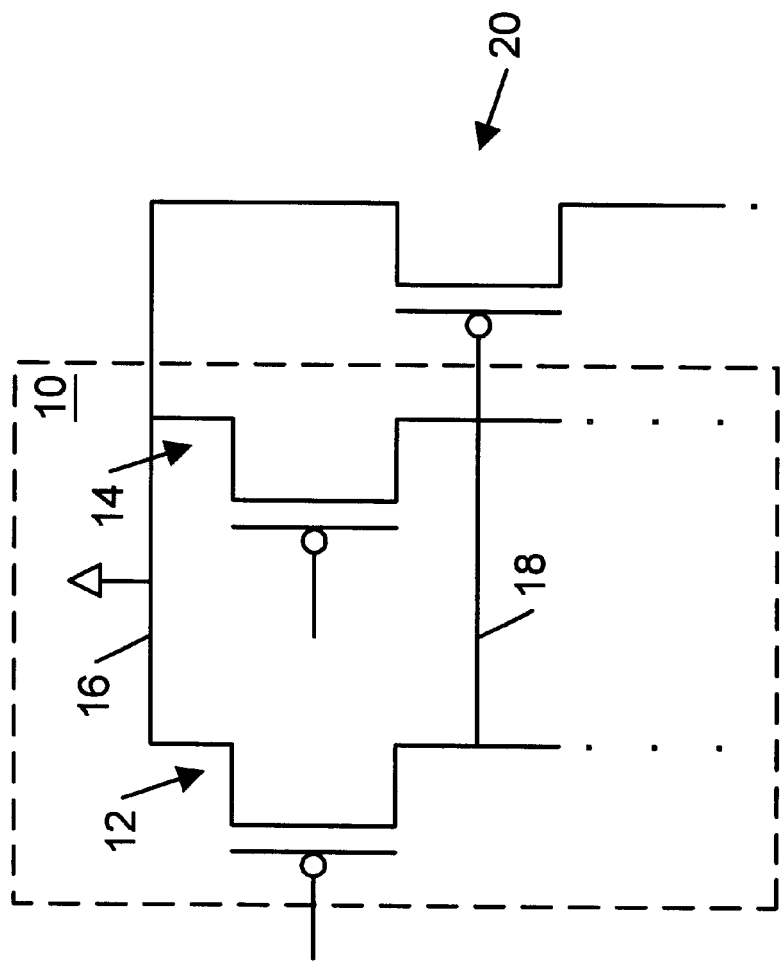
FIG. 1 is a circuit level partial core logic showing a mutually connected source junction and a mutually connected drain junction.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
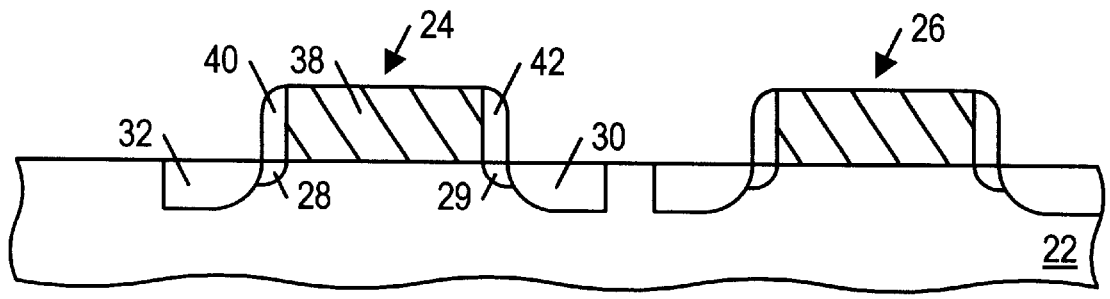
FIG. 2 is a cross-sectional view of a semiconductor topography embodying a pair of transistors laterally spaced from one another.

Turning to FIG. 2, a semiconductor topography 24 is depicted in which a transistor 24 is laterally spaced from another transistor 26. The two transistors are disposed upon and within a single crystalline silicon substrate 22. Substrate 22 is preferably doped with either p-type dopants or n-type dopants. Some commonly used p-type dopants are boron or boron difluoride, and some commonly used n-type dopants are arsenic or phosphorus. A gate conductor 38 of transistor 24 may be formed from CVD deposited polysilicon. Conductor 38 may be patterned using a masking layer created using photolithography. A dry etch process may be used to etch away unmasked portions of the polysilicon to complete gate conductor formation.

A lightly doped drain ("LDD") implant is self-aligned to gate conductor 16. This implant is shown as LDD areas 28 and 29 within the upper surface of substrate 22. LDD areas 28 and 30 form lightly doped regions on opposite sides of a channel existing below conductor 38. Oxide spacers 40 and 42 are then formed upon opposite lateral (i.e., sidewall) surfaces of gate conductor 38. The spacers are formed via depositing an oxide across gate conductor 38 and substrate 22. Subsequently, the oxide is anisotropically removed, leaving oxide spacers 40 and 42 exclusively on sidewall surfaces of gate conductor 38. To complete the fabrication of transistor 24, a source and drain implant is forwarded to the upper surface of substrate 22 to form heavily doped source and drain junctions 30 and 32 which are self-aligned to the gate conductor and oxide spacers. Although not labeled for brevity and clarity in the drawings, transistor 26 is preferably formed similarly to transistor 24.

Figure 3:
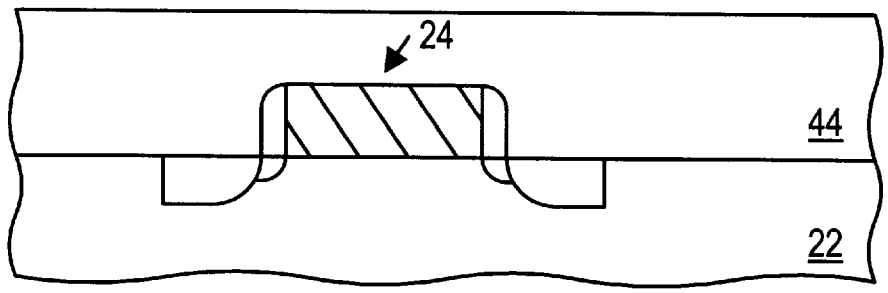
FIG. 3 is a cross-sectional view of a portion of the semiconductor topography, wherein an primary interlevel dielectric is deposited across the semiconductor topography, subsequent to the step in FIG. 2.
Figure 4:
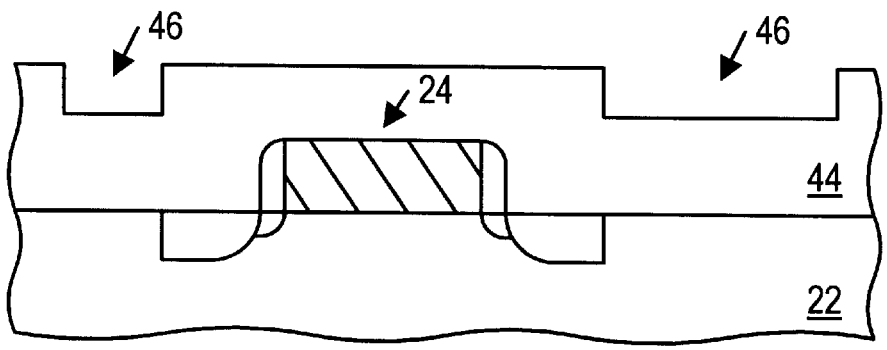
FIG. 4 is a cross-sectional view of the semiconductor topography, wherein portions of the primary internal dielectric are removed to form trenches, subsequent to the step in FIG. 3.

FIG. 3 depicts only a portion of the semiconductor topography shown in FIG. 1. A primary interlevel dielectric 44 is shown as being blanket deposited across, e.g., transistor 24 and substrate 22. Chemical-mechanical polishing may be used to make the upper surface of interlevel dielectric 44 somewhat planar. Interlevel dielectric 44 is composed of silicon dioxide but may comprise other insulating materials as well. Various methods may be used to form interlevel dielectric 44, including deposition of an oxide- or glass-based material. As shown in FIG. 4, select portions of primary interlevel dielectric 44 are removed using either a wet chemical or a dry, plasma etch. Thus, trenches 46 and 48 are formed within the upper surface of interlevel dielectric 44. These trenches are a spaced distance above and a lateral distance from transistor 24. A timed etch may be used, whereby the base of each trench does not extend downward to the underlying substrate 22 or transistor 24. Preferably, etch is terminated before removing more than, for example, 70 percent of the interlevel dielectric 44 thickness.

Figure 5:
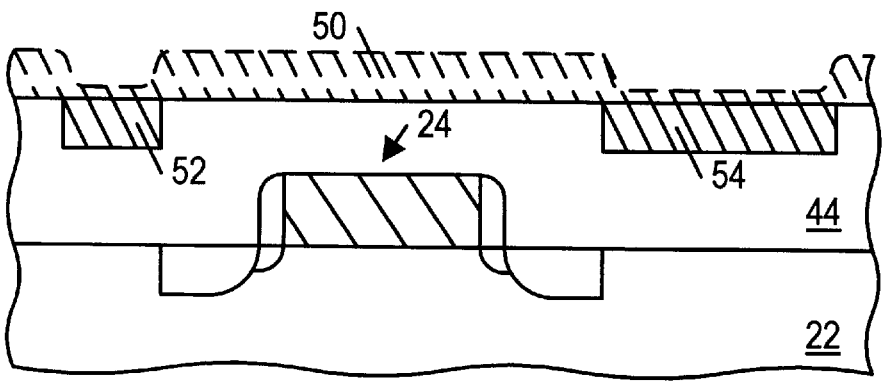
FIG. 5 is a cross-sectional view of the semiconductor topography, wherein polysilicon is arranged exclusively within the trenches, subsequent to the step in FIG. 4.

FIG. 5 illustrates polysilicon formation exclusively within the trenches of interlevel dielectric 44. After the polysilicon is CVD deposited across dielectric 44 and into the trenches, a portion 50 of the polysilicon is etched away. The remaining polysilicon is bounded only within the trenches, thereby forming polysilicon structures 52 and 54 which are spaced apart. Various techniques may be used to remove polysilicon outside the trenches and, specifically, remove polysilicon from interlevel dielectric 44 upper surface. Regardless of the technique used, polysilicon is eliminated from dielectric 44 upper surface, leaving polysilicon structures having an upper surface commensurate with dielectric 44 upper surface.

Figure 6:
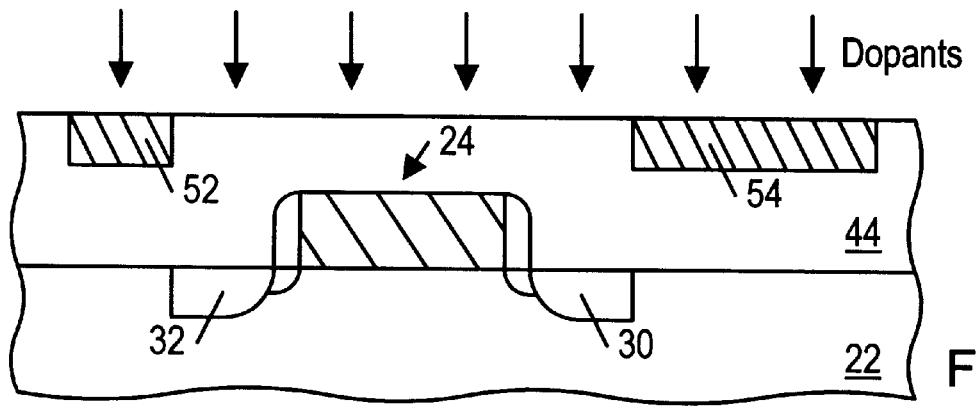
FIG. 6 is a cross-sectional view of the semiconductor topography, wherein the polysilicon structures are implanted with dopants, subsequent to the step in FIG. 5.
Figure 7:
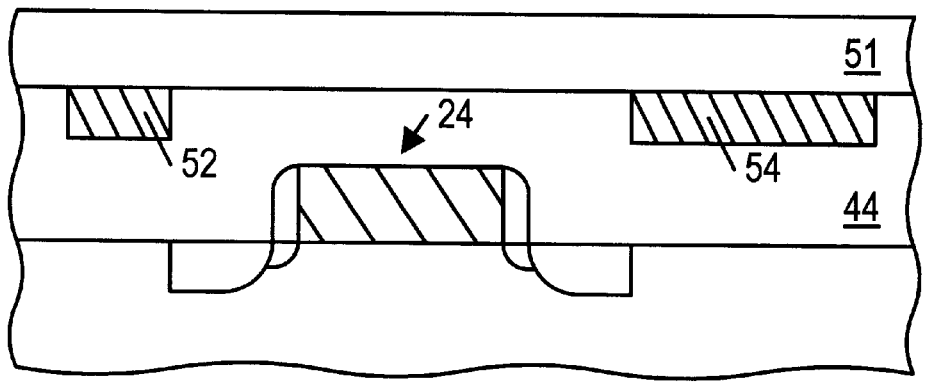
FIG. 7 is a cross-sectional view of the semiconductor topography, wherein a secondary interlevel dielectric is deposited across the primary interlevel dielectric and the doped polysilicon structures, subsequent to the step in FIG. 6.

As shown in FIG. 6, dopants are then forwarded to polysilicon structures 52 and 54, thereby implanting structures 52 and 54. The type of dopant used here is preferably chosen such that structures 52 and 54 have a majority carrier opposite that of junctions 30 and 32 below. That is, if junctions 30 and 32 are p-type junctions, then polysilicon structures 52 and 54 contain n-type dopants, and vice-versa. The dopants are preferably forwarded by ion implantation at an energy such that the peak concentration is approximately at the midline between the upper and lower surfaces of the polysilicon structure. The concentration is chosen to effectuate whatever threshold voltage is needed to operate, within the design specification, the ensuing transistor. FIG. 7 depicts that a secondary interlevel dielectric 51 is deposited across primary interlevel dielectric 44 and doped structures 52 and 54. Secondary interlevel dielectric 51 can be planarized if needed. However, it is likely that planarization is not needed since the underlying topography on which it is placed is relatively planar.

Figure 8:
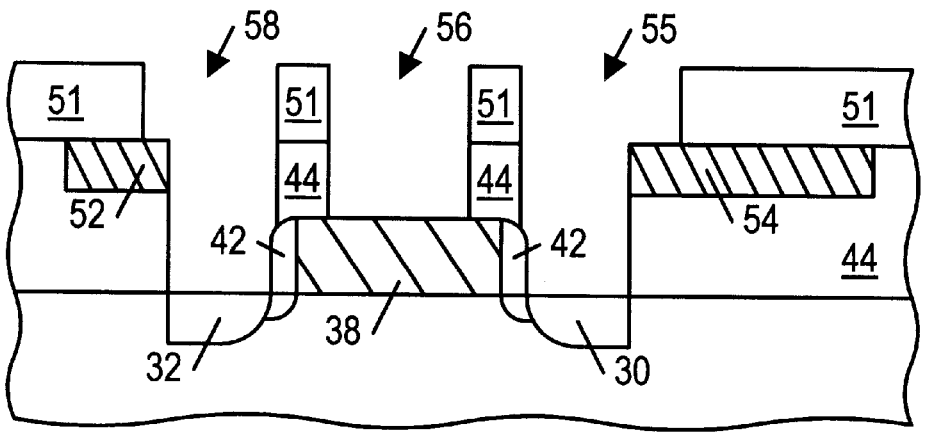
FIG. 8 is a cross-sectional view of the semiconductor topography, wherein portions of the primary and secondary interlevel dielectrics are removed, according to one example, to partially pose junctions of a transistor, the gate conductor of the transistor, and the polysilicon structures, subsequent to the step in FIG. 7.

Turning to FIG. 8, portions of primary and secondary interlevel dielectrics 51 and 44 are removed, thereby forming openings 55, 56, and 58 through the dielectric layers. The removal of these portions may be done using wet etch or dry etch. For the wet etch process, an etchant may be chosen that selectively removes the interlevel dielectric and not polysilicon or silicon substrate. Two separate masking steps may be performed sequentially to remove the select portions of primary dielectric and secondary dielectric. Opening 55 exposes a portion of an upper surface of polysilicon structure 54 as well as a sidewall surface of structure 54 that is located proximate the upper surface portion. Opening 55 further exposes junction 30 and is partially defined between oxide spacer 42 and the nearest sidewall surface of structure 54. Therefore, according to one preferred embodiment, the later extent of structure 54 aligns directly over the lateral extent of junction 30. Opening 56, i.e., via 56, extends vertically through dielectrics 44 and 51 to gate conductor 38. Opening 58 exposes the other junction 32 and the sidewall surface of structure 52 which is in close proximity to or aligned with the outward extent of junction 32. Opening 58 also exposes a portion of the upper surface of polysilicon structure 52. Opening 58 is bound partially between oxide spacer 42 and the nearest sidewall surface of structure 52.

Figure 9:
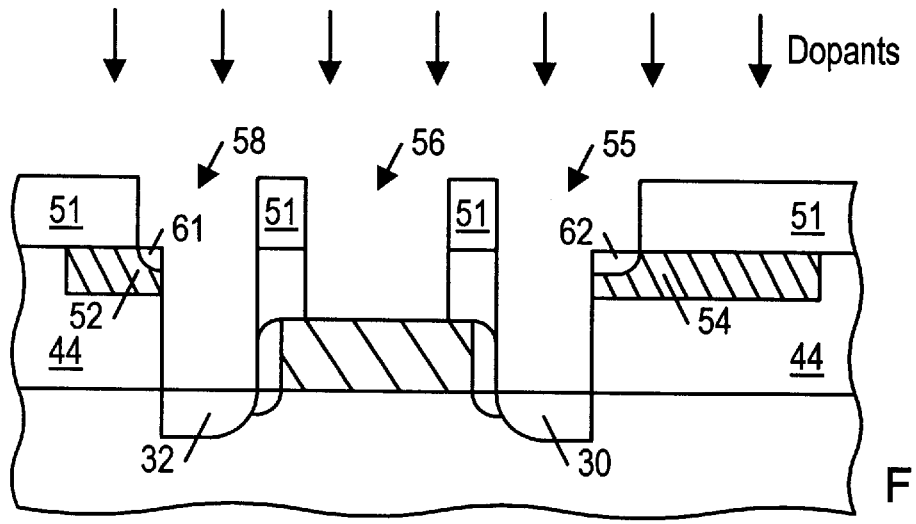
FIG. 9 is a cross-sectional view of the semiconductor topography, wherein exposed portions of each polysilicon structures, may be implanted to form junctions within the elevated polysilicon structures, subsequent to the step in FIG. 8.
Figure 10:
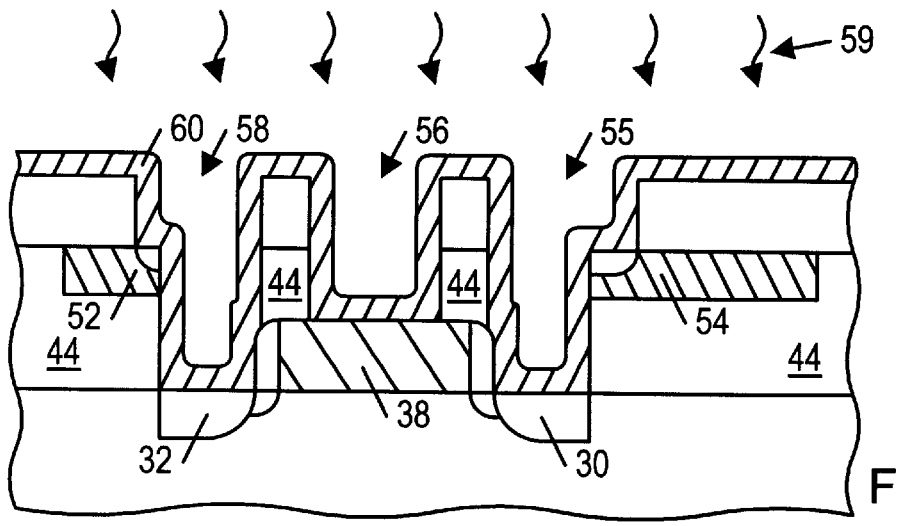
FIG. 10 is a cross-sectional view of the semiconductor topography, wherein a conductive layer is formed across the exposed surface, and the conductive layer is sequentially subjected to thermal radiation, subsequent to the step in FIG. 9.

FIG. 9 depicts implantation of the exposed upper surfaces of polysilicon structures 52 and 54. The same dopant type as that used to implant junctions 30 and 32 is used to form junctions 61 and 62 within the exposed surfaces of structures 52 and 54. As illustrated in FIG. 10, a conductive layer 60 that readily reacts with silicon to form a self-aligned silicide, i.e., salicide, may then deposited upon the upper exposed surface of the semiconductor topography. For example, conductive layer 60 may be titanium. Thus, as conductive layer 60 is subjected to thermal energy 59, cross-diffusion of titanium atoms and silicon atoms occurs at the interfaces where layer 60 contacts junctions 61 and 62 of polysilicon structures 52 and 54, gate conductor 38, and junctions 30 and 32.

Figure 11:
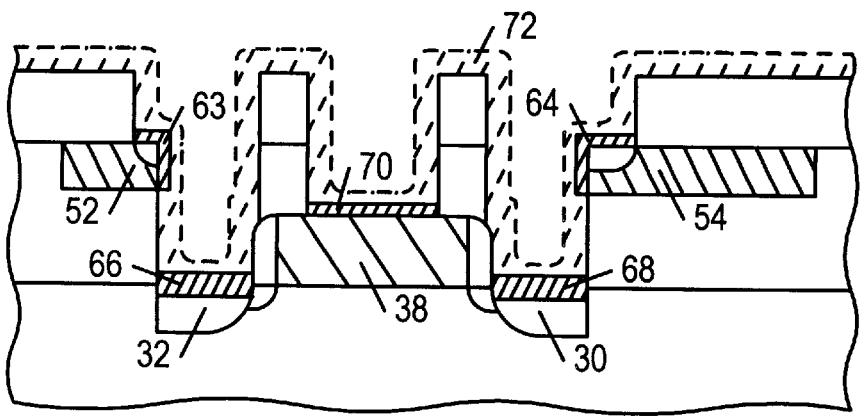
FIG. 11 is a cross-sectional view of the semiconductor topography, wherein a silicide layer is formed at the conductive layer/silicon interfaces, subsequent to the step in FIG. 10.
Figure 12:
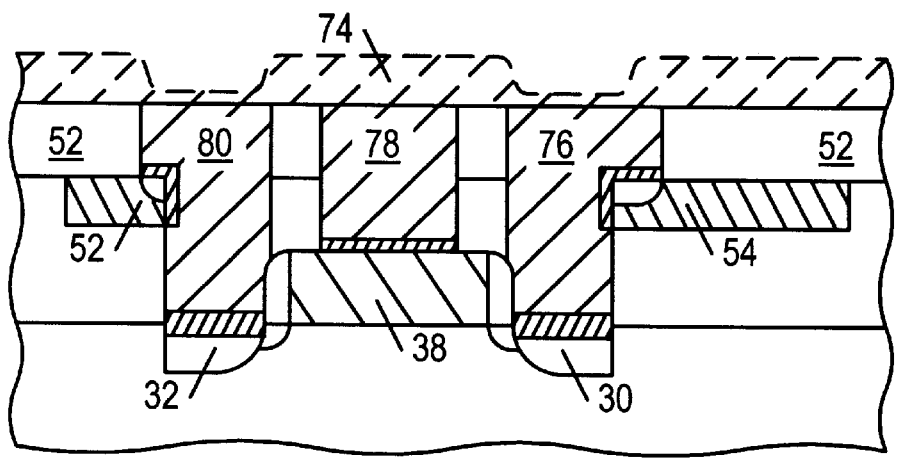
FIG. 12 is a cross-sectional view of the semiconductor topography, wherein a conductive material is bound exclusively within the removed portions of the primary and secondary interlevel dielectrics, subsequent to the step in FIG. 11.

As shown in FIG. 11, titanium salicide contact regions 63, 64, 66, 68, and 70 result. A portion 72 of conductive layer 60 is not converted into titanium salicide since this portion is isolated from silicon-containing material. Portion 72 may be etched away, and conductive material may then be deposited across secondary dielectric 51 and into openings 55, 56 and 58. The conductive material is shown in FIG. 12 within openings 55, 56 and 58 as 76, 78 and 80, respectively, a suitable material being, e.g., tungsten. Thereafter, a portion 74 of this conductive material may be removed to form conductors 76, 78 and 80 exclusively within the openings. It is recognized that conductors 76 and 80 are interconnect, localized between two vertically displaced regions. Interconnect 76 couples source junction 30 to elevated polysilicon structure 54, which may also be a source region. Interconnect 80 couples drain junction 32 to elevated polysilicon structure 52, which may be used as a drain region also.

Figure 13:
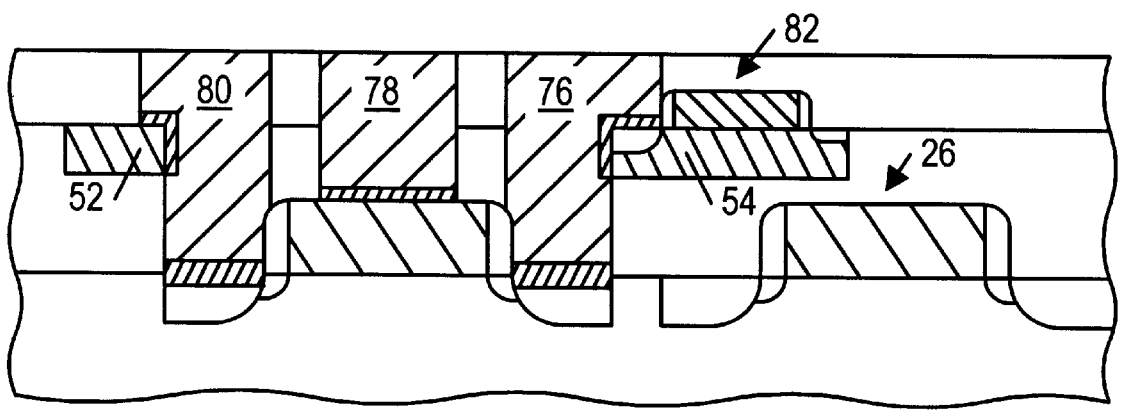
FIG. 13 is a cross-sectional view of the semiconductor topography, wherein a transistor is formed upon one of the doped polysilicon substrates, subsequent to FIG. 12.

FIG. 13 illustrates an embodiment in which a transistor 82 is formed upon and within polysilicon structure 54 (i.e., upon and within the elevated polysilicon substrate 54). Therefore, elevated polysilicon substrates hereof are beneficial because they free up space within an underlying substrate that may be used for other transistors, such as transistor 26. Because transistor 82 is a spaced distance above substrate 22, transistor 26 may lie below transistor 82. Furthermore, the elevated polysilicon substrate may serve as source or drain regions coupled to other junctions or gate conductors. A source or drain region located above a substrate may be coupled to junctions or gate conductors via an interconnect extending contiguously therebetween as illustrated by interconnects 80 and 76.

Polysilicon structure 52, like polysilicon structure 54, is selected doped by opening dopant avenues through secondary interlevel dielectric 51 to select portions of the polysilicon surface. Those regions can be later filled with a dielectric or possibly conductive material to provide electrical access to yet another level of transistor-embodied polysilicon. Coupling between transistors formed in elevated polysilicon substrates occurs at the lateral edges of the polysilicon to continue to trend vertically for a multi-level integrated circuit having at least two levels.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming an integrated circuit, comprising:

providing a transistor comprising a gate conductor spaced between a pair of junctions, and further providing a primary interlevel dielectric upon the transistor;

forming a first polysilicon structure within a select portion of an upper surface of the primary interlevel dielectric, said first polysilicon structure being a spaced distance above and a lateral distance from the transistor;

implanting a dopant into the first polysilicon structure;

depositing a secondary interlevel dielectric across the primary interlevel dielectric and the doped first polysilicon structure;

removing a first portion of said primary interlevel dielectric and said secondary interlevel dielectric to expose one of the pair of junctions and a portion of the doped first polysilicon structure arranged in proximity to said one of the pair of junctions; and depositing a conductive material within said removed first portion of the primary and secondary interlevel dielectrics to form an interconnect contiguously extending between said one of the pair of junctions and said portion of the doped first polysilicon structure.

2. The method as recited in claim 1, wherein said transistor comprises a spacer arranged exclusively upon opposed lateral surfaces of the gate conductor.

3. The method as recited in claim 2, wherein said removed first portion of said primary interlevel dielectric is bounded partially between said spacer and a lateral surface of the doped first polysilicon structure.

4. The method as recited in claim 1, wherein said interconnect extends contiguously from a portion of an upper surface of the doped polysilicon structure to a lateral surface of the doped first polysilicon structure, said lateral surface of the doped first polysilicon structure and said portion of the upper surface of the doped polysilicon structure being separated by a comer of the doped polysilicon structure.

5. The method as recited in claim 1, further comprising removing a second portion a lateral spaced distance from the first portion to expose said gate conductor concurrent with removing the first portion.

6. The method as recited in claim 5, further comprising forming a conductive plug extending to said gate conductor and being bounded within said removed first portion concurrent with the step of depositing the conductive material.

7. The method as recited in claim 1, further comprising forming a second polysilicon structure a lateral distance from said first polysilicon structure concurrent with forming the first polysilicon structure, said second polysilicon structure being a spaced distance above and a lateral distance from the transistor.

8. The method as recited in claim 7, further comprising implanting a dopant into the second polysilicon structure concurrent with implanting a dopant into the first polysilicon structure.

9. The method as recited in claim 7, further comprising removing other portions of said primary interlevel dielectric and said secondary interlevel dielectric to expose another of said pair of junctions and a portion of said second polysilicon structure arranged proximate to said another of the pair of junctions, concurrent with removing the first portion of said primary interlevel dielectric and said secondary interlevel dielectric.

10. The method as recited in claim 9, further comprising forming another interconnect contiguously extending between said another oF the pair of junctions and said portion of the second polysilicon structure concurrent with depositing said conductive material.

11. The method as recited in claim 1, further comprising forming a metal silicide layer across said one of the pair of junctions and said exposed portion of the first polysilicon structure prior to depositing said conductive material.

12. The method as recited in claim 11, further comprising implanting a dopant into said exposed portion of the first polysilicon structure prior to forming said silicide layer.

* * * * *

UNITED STATES PATENT AND TRADEMARK OFFICE
CERTIFICATE OF CORRECTION

PATENT NO. : 5,926,700

DATED : July 20, 1999

INVENTOR(S) : Gardner et al.

It is certified that error appears in the above-identified patent and that said Letters Patent is hereby corrected as shown below:

Claim 4, col. 8, line 9, after the phrase "separated by a" please delete "comer" and substitute therefor --corner--.

Claim 10, col. 8, line 38, after the phrase "between said another" please delete "oF" and substitute therefor --of--.

Signed and Sealed this

Fourteenth Day of December, 1999

Attest:

Q. TODD DICKINSON

Attesting Officer

Acting Commissioner of Patents and Trademarks